(12) United States Patent
Moon et al.

(10) Patent No.: US 8,008,672 B2
(45) Date of Patent: Aug. 30, 2011

(54) LIGHT EMITTING DEVICE

(75) Inventors: Yong Tae Moon, Seoul (KR); Chunli Liu, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/980,136

(22) Filed: Dec. 28, 2010

(65) Prior Publication Data

US 2011/0156088 A1 Jun. 30, 2011

(30) Foreign Application Priority Data

Dec. 29, 2009 (KR) .................. 10-2009-0132731

(51) Int. Cl.
*H01L 33/00* (2010.01)
*H01L 21/56* (2006.01)

(52) U.S. Cl. ............... 257/79; 257/13; 257/88; 257/98; 257/E33.001; 257/E33.005; 257/E33.008; 438/27; 438/34; 438/45

(58) Field of Classification Search ............ 257/13, 257/79, 88, 98, E33.001, E33.005, E33.008; 438/27, 34, 45

See application file for complete search history.

(56) References Cited

U.S. PATENT DOCUMENTS

| | | | |
|---|---|---|---|
| 2004/0094756 A1 | 5/2004 | Moon et al. | |
| 2004/0105481 A1 | 6/2004 | Ishida et al. | |
| 2005/0199888 A1 | 9/2005 | Seong et al. | |
| 2005/0199895 A1 | 9/2005 | Seong et al. | |
| 2006/0158089 A1 | 7/2006 | Saito et al. | |
| 2006/0164003 A1* | 7/2006 | Chan et al. | 313/498 |
| 2007/0023763 A1* | 2/2007 | Takigawa et al. | 257/79 |
| 2007/0040162 A1 | 2/2007 | Song | |
| 2008/0303018 A1* | 12/2008 | Kim et al. | 257/13 |
| 2010/0012961 A1* | 1/2010 | Tobise | 257/98 |
| 2010/0110728 A1* | 5/2010 | Dubrow et al. | 362/615 |
| 2010/0264400 A1* | 10/2010 | Kim | 257/13 |

FOREIGN PATENT DOCUMENTS

| | | |
|---|---|---|
| JP | 2005-072096 | 3/2005 |
| JP | 2007059762 | 3/2007 |
| KR | 20070088006 | 8/2007 |
| KR | 20090009176 | 1/2009 |
| KR | 1020090044790 | 5/2009 |
| WO | WO 01/41225 | 6/2001 |
| WO | WO2009/048425 | 4/2009 |

OTHER PUBLICATIONS

Wang, H., et al., "White light emitting diodes realized by using an active packaing method with CdSe/ZnS quantum dots dispersed in photosensitive epoxy resins," *Nanotechnology*, (Apr. 9, 2008), 19:14:1-4.
European Search Report for Application No. 10195182.0-2222 dated Mar. 29, 2011.

(Continued)

*Primary Examiner* — Dao H Nguyen
(74) *Attorney, Agent, or Firm* — Ked & Associates LLP

(57) ABSTRACT

A light emitting device includes at least one particle over the light emitter. Light at a first wavelength travels from the emitter along a first path adjacent to the particle and at a second wavelength along a second path that passes through the particle. The particle converts the light on the second path from the first wavelength into a second wavelength. The light at the first wavelength mixes with the light at the second wavelength to form light of a third wavelength, which may be white light or another color.

9 Claims, 6 Drawing Sheets

OTHER PUBLICATIONS

Korean Notice of Submission of Opinion dated Jun. 14, 2010 in Application No. 10-2009-0132731.

Korean Notice of Allowance dated Oct. 4, 2010 issued in Application No. 10-2009-0132731.

* cited by examiner

[FIG. 1]
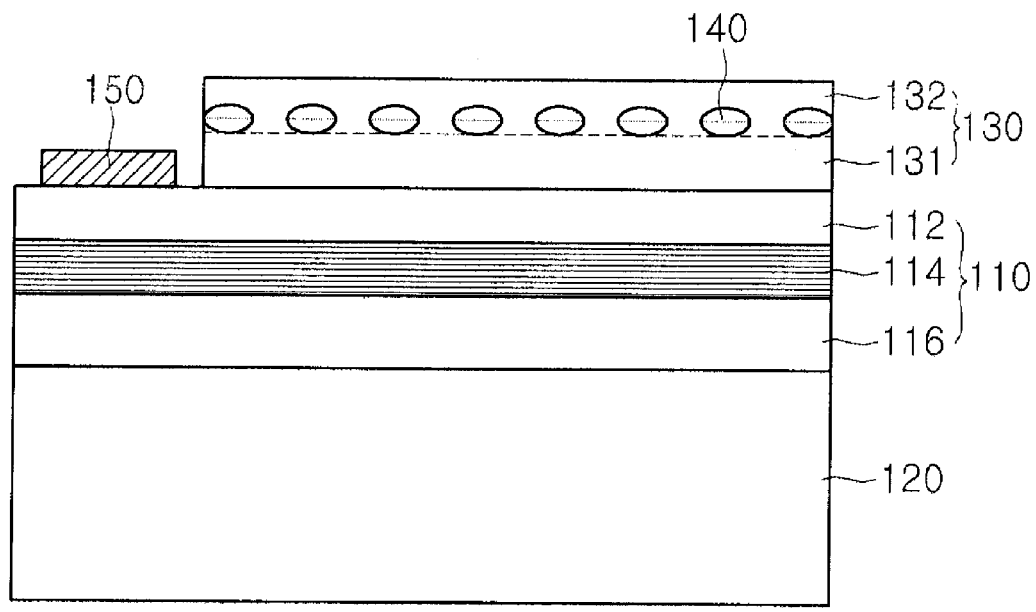
[FIG. 2]
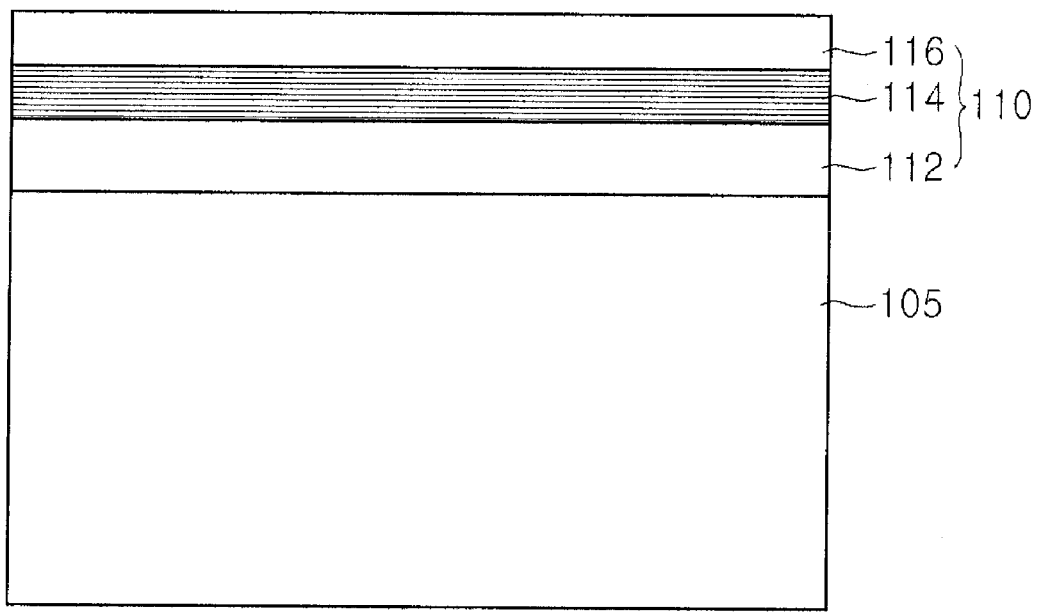

[FIG. 3]
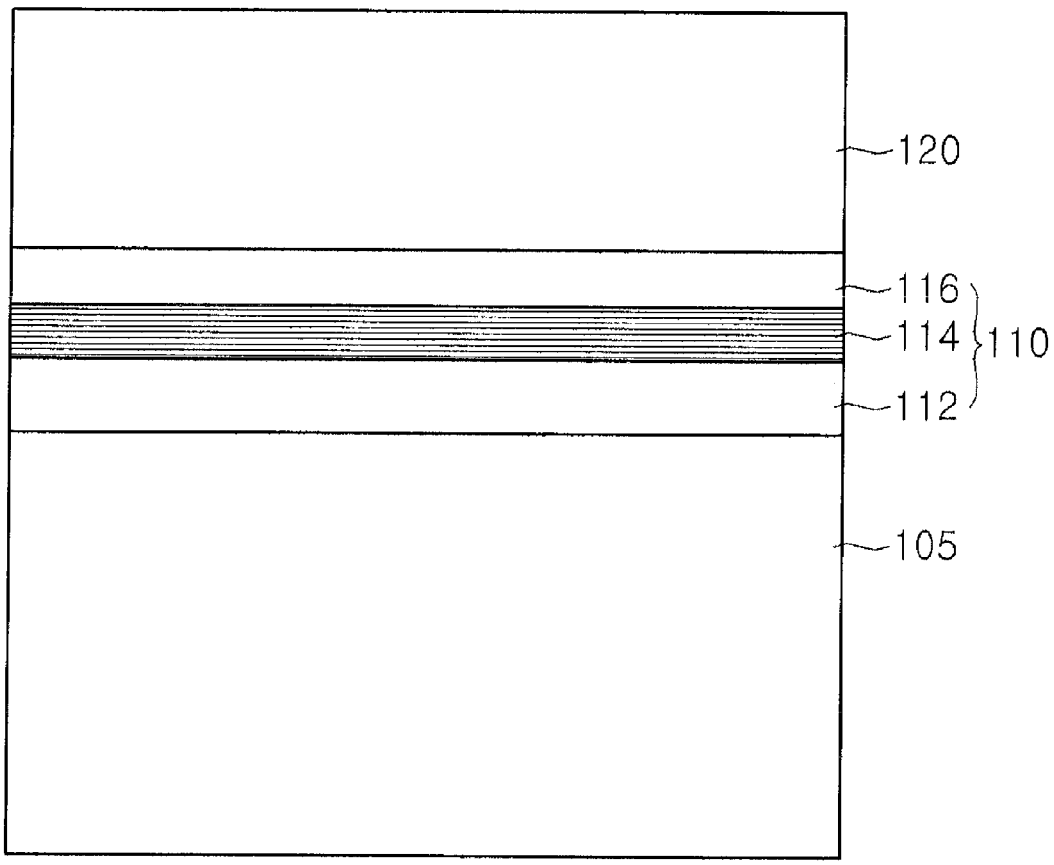
[FIG. 4]
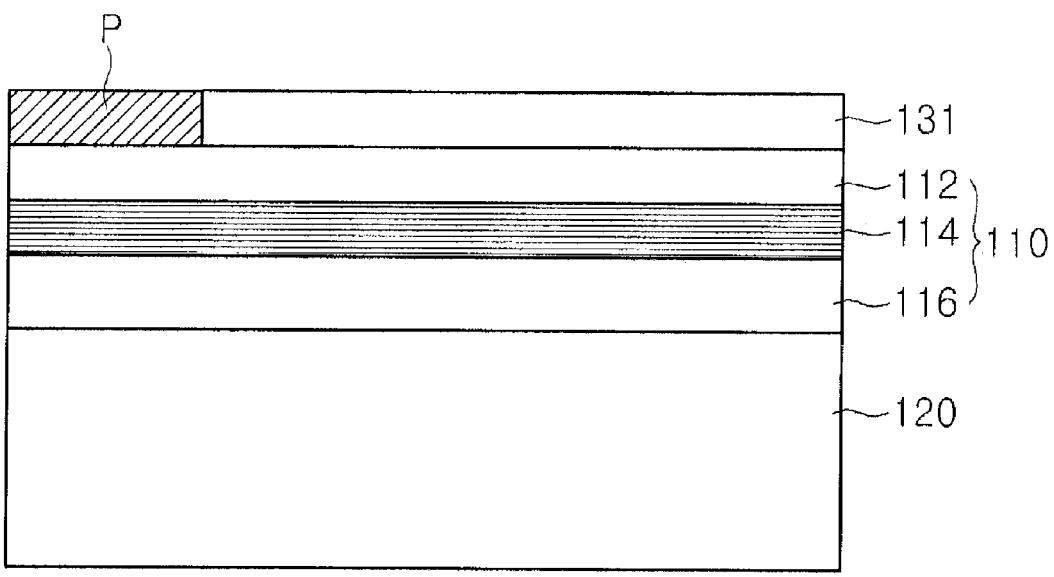

[FIG. 5]
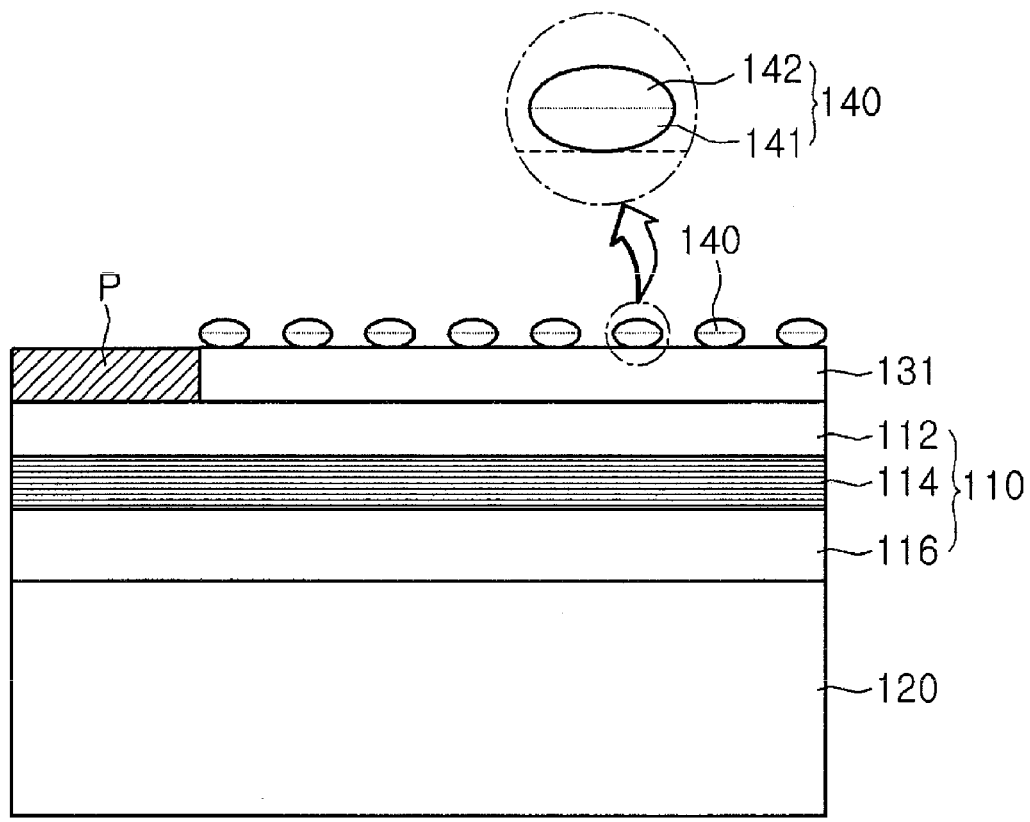
[FIG. 6]
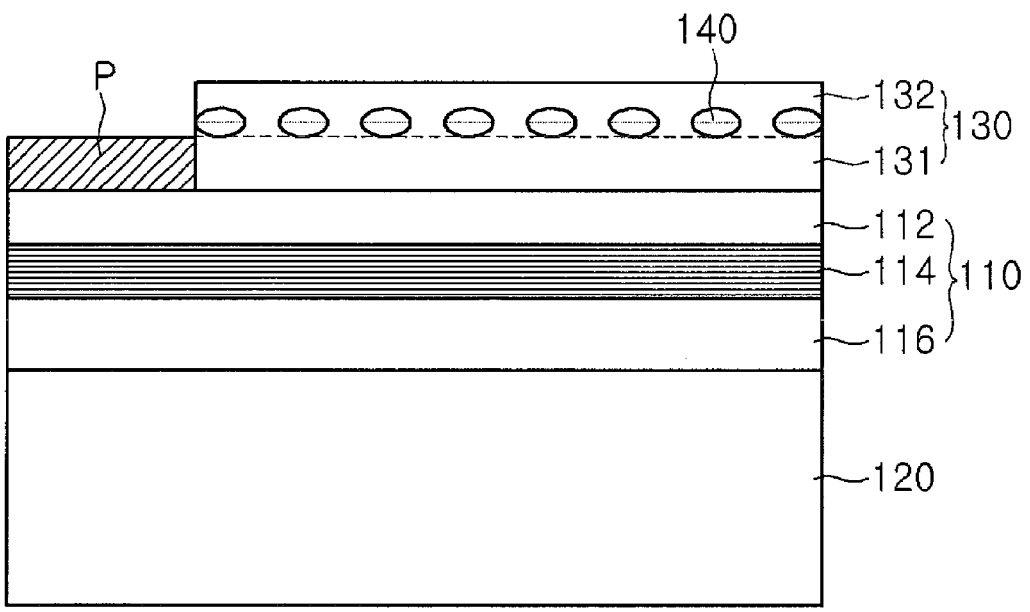

【FIG. 7】
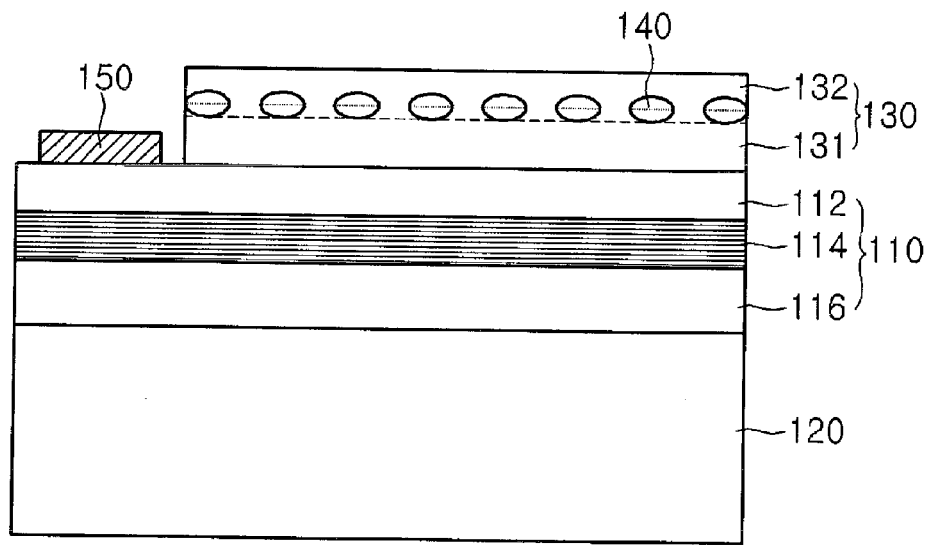
【FIG. 8】
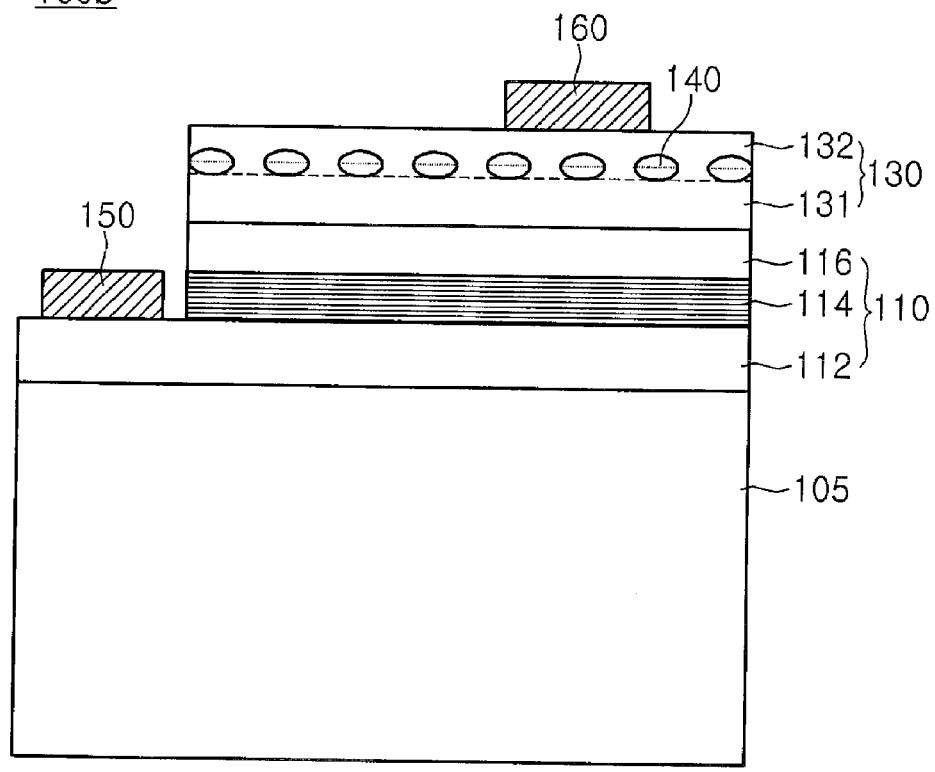

[FIG. 9]
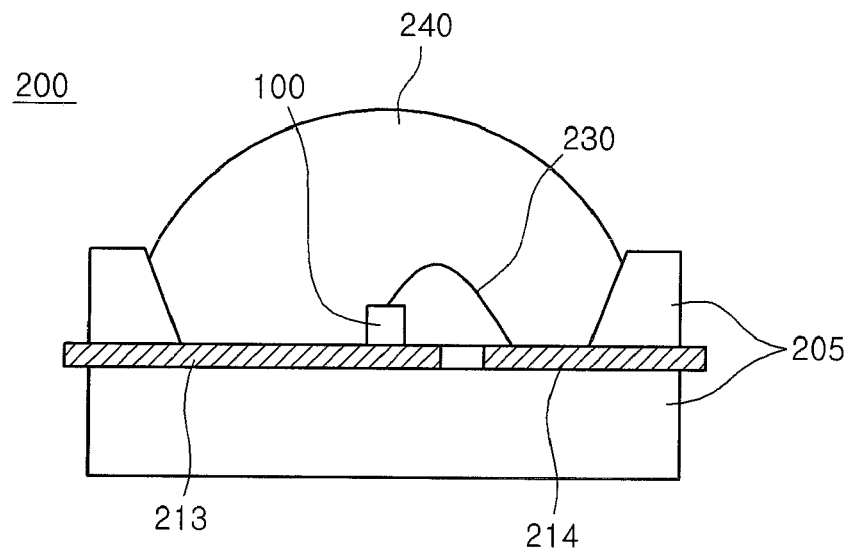
[FIG. 10]
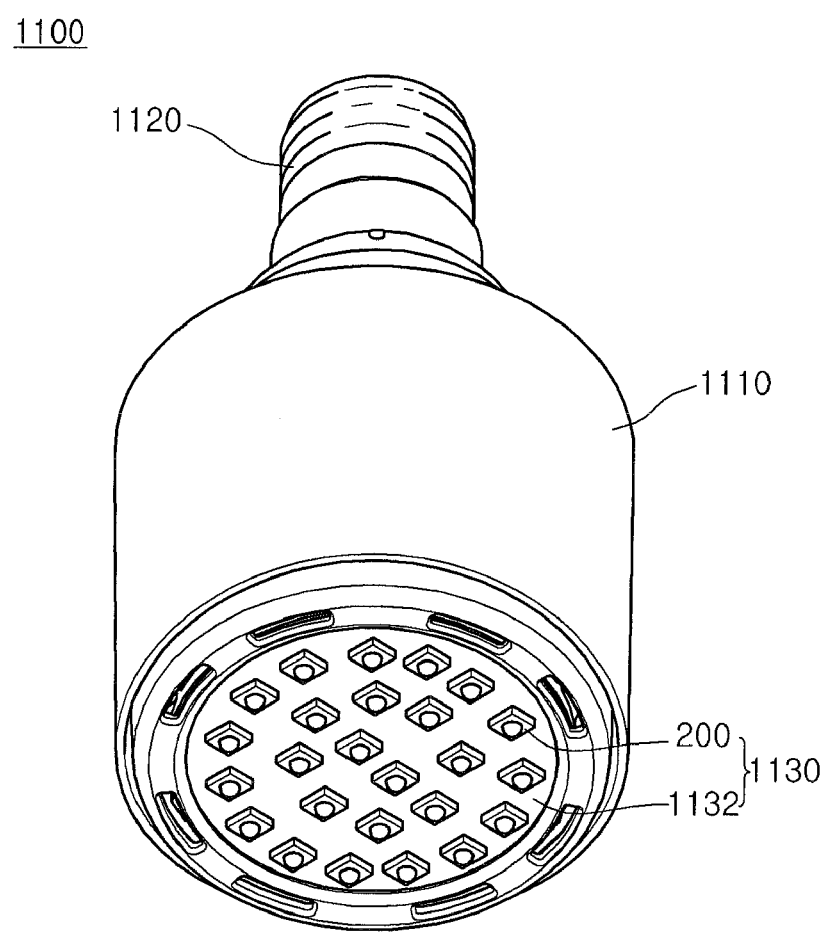

[FIG. 11]
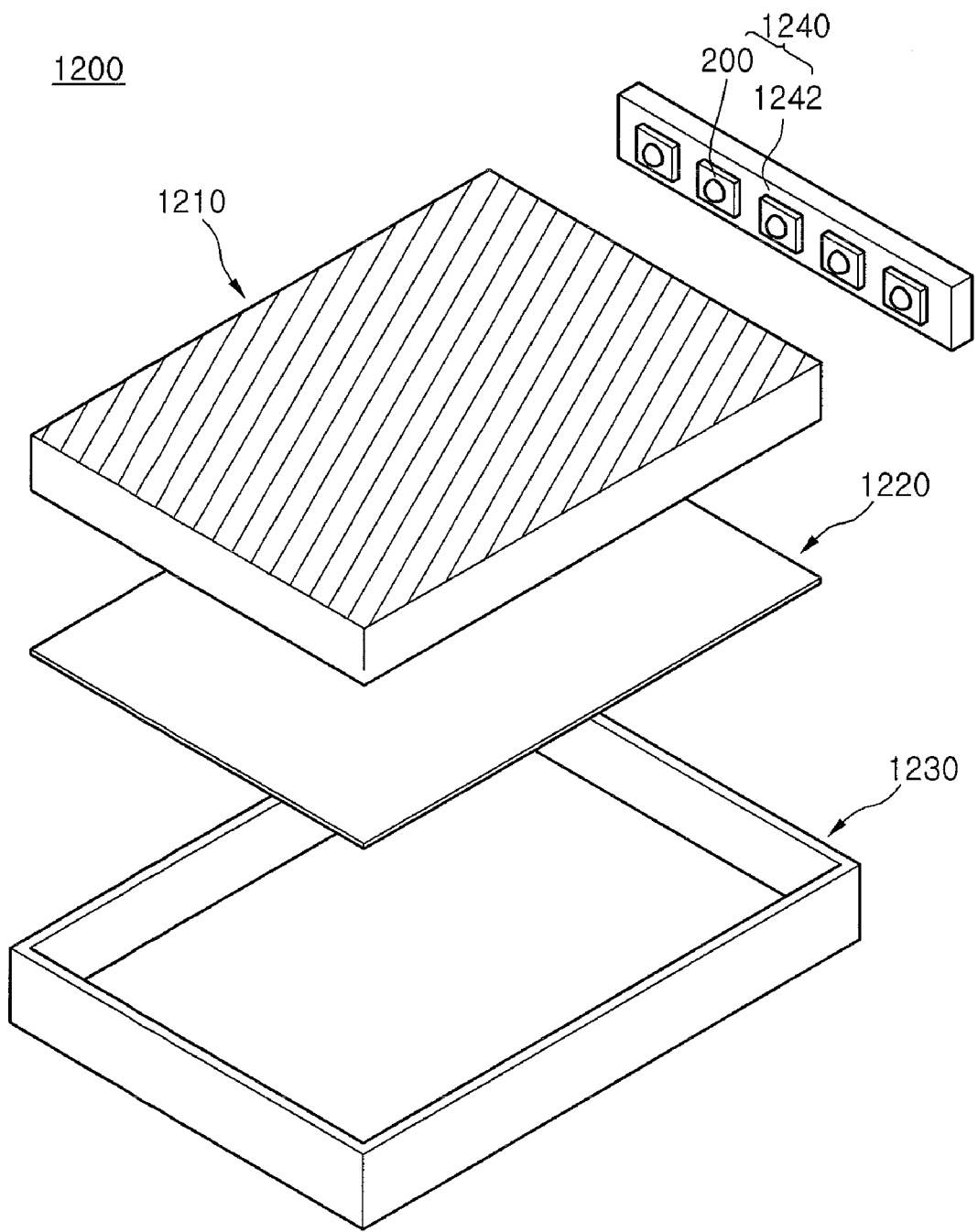

LIGHT EMITTING DEVICE

CROSS-REFERENCE TO RELATED APPLICATIONS

The present application claims priority under 35 U.S.C. §119 to Korean Patent Application No. 10-2009-0132731 filed on Dec. 29, 2009, which is hereby incorporated by reference in its entirety.

BACKGROUND

1. Field

One or more embodiments described here relate to emission of light.

2. Background

A light emitting device (LED) may be formed using various semiconductor materials and have been shown to have lower power consumption and higher efficiency compared with more traditional forms of illumination. However, improvements are needed.

BRIEF DESCRIPTION OF THE DRAWINGS

FIG. 1 is a diagram of a first embodiment of a light emitting device.

FIGS. 2 to 7 are diagrams showing various stages of fabrication in one embodiment of a method for manufacturing a light emitting device.

FIG. 8 is a diagram of a second embodiment of a light emitting device.

FIG. 9 is a diagram of an embodiment of a light emitting device package that may include one or more of the aforementioned embodiments of the light emitting device.

FIG. 10 is a diagram of one embodiment of a lighting unit which may include one or more of the aforementioned embodiments of the light emitting device or package.

FIG. 11 is a diagram of a backlight unit which may include one or more of the aforementioned embodiments of the light emitting device, package, or lighting unit.

DETAILED DESCRIPTION

FIG. 1 shows, in cross-section, a first embodiment of a light emitting device which includes a light emitting structure 110 including a first semiconductor layer 112 of a first conductivity type, an active layer 114, and a second semiconductor layer 116 of a second conductivity type. The device further includes a first amorphous layer 131 on the light emitting structure 110 and a nanostructure 140 on the first amorphous layer 131. FIG. 1 shows the light emitting device as a vertical-type device. However, in other embodiments, the device may be a horizontal type or another type.

The first amorphous layer 131 may include an amorphous nitride layer or an amorphous oxide layer. For example, the first amorphous layer 131 may be formed of $Si_3N_4$, AlN, GaN, or $SiO_2$, but is not limited thereto. Also, the first amorphous layer 131 may be formed of a transparent material.

Under some circumstances, it may be difficult to form a nitride semiconductor having a thin-film shape on an amorphous layer. Thus, according to one embodiment, the nitride semiconductor may be grown in particle form having a nano size. The particle may have any one of a variety of shapes including an island shape, any type of regular or geometrical shape, or even an irregular shape. Furthermore, the particles may be spaced uniformly or randomly and/or may be provided in clusters. In one embodiment, only one particle may be provided.

The first amorphous layer 131 may be formed using a metal organic chemical vapor deposition (MOCVD) process to uniformly distribute nanoparticles formed of $Si_3N_4$, AlN, or GaN, but is not limited thereto.

According to one embodiment, the nanostructure 140 may include a nitride semiconductor nanostructure. For example, the nanostructure 140 may be formed of $Al_xIn_yGa_{(1-x-y)}N$ ($0 \leq x \leq 1$, $0 \leq y \leq 1$), $0 \leq x+y \leq 1$).

Additionally, the nanostructure 140 may include a first nanostructure 141 on the first amorphous layer 131 and a second nanostructure 142 on the first nanostructure 141 as shown in FIG. 5. For example, the nanostructure 140 may include the first nanostructure 141 formed of AlN or GaN and the second nanostructure 142 formed of InGaN on the first nanostructure 141.

In one embodiment, the first nanostructure 141 and the second nanostructure 142 may be repeatedly stacked in plurality to form the nanostructure 140. For example, a GaN/InGaN multi-layer may be deposited in the present embodiment. Because InGaN has indium segregation that is an inherent property of a material, high-quality InGaN having a large amount of indium composition may be realized when the InGaN is formed on the nanoparticles using the indium segregation.

The nanoparticles may be have substantially consistent or different sizes and/or shapes, and may be formed under various growth conditions. The nanoparticles may also have consistent or different compositions, in order to realize a color having a desired wavelength, i.e., a blue color, a green color, a yellow color, or a red color.

The nanostructure may convert light emitted from the active layer (e.g. shorter wavelength) into light having a longer wavelength. The converted light may then be mixed with light that is not converted as emitted from the active layer, to thereby realize white light or light of an intended color. In another embodiment, the nanostructure may convert longer wavelength light into shorter wavelength light, either to be mixed or directed along separate paths.

A second amorphous layer 132 may be disposed on the nanostructure 140. The second amorphous layer 132 may adopt technological properties of the first amorphous layer 131. In the present embodiment, a combination layer of the first amorphous layer 131 and the second amorphous layer 132 may be called an amorphous layer 130.

In one embodiment, the second amorphous layer 132 may act as a passivation layer of the nitride semiconductor nanostructure 140. Also, the second amorphous layer may serve as a passivation function.

In the present embodiment, the nanostructure 140 and the amorphous layer 130 may be repeatedly multi-stacked to improve light emitting efficiency. \

Also, an existing phosphor may be replaced with the nitride semiconductor nanostructure 140. The nitride semiconductor nanostructure 140 according to the present embodiment may be disposed on the first amorphous layer 131 using the MOCVD process and have a particle shape having a nanometer size, but a thin film shape. For example, the nitride semiconductor nanostructure 140 may have an island shape and a structure in which InGaN and GaN are multi-deposited.

In the present embodiment, since the nanostructure 140 is grown in a nitride semiconductor particle shape, but a thin film shape, a crystal quality is not deteriorated even though a large amount of indium composition is contained.

Also, the InGaN nitride semiconductor forming the nanostructure according to the present embodiment has essentially superior light emitting efficiency in material itself than a related art phosphor such as yttrium aluminum garnet (YAG).

FIGS. 2 to 7 shows different stages of fabrication produced by one embodiment of a method for manufacturing the light emitting device, which, for example, may correspond to the device shown in FIG. 1. Although a light emitting structure is formed on a non-conductive substrate and a process for removing the non-conductive substrate is described in FIGS. 2 to 7, the present disclosure is not limited thereto. For example, the light emitting structure may be formed on a conductive substrate such as a GaN substrate.

First, as shown in FIG. 2, a first substrate 105 is prepared. The first substrate 105 may be formed of at least one of sapphire ($Al_2O_3$), SiC, Si, GaAs, GaN, ZnO, Si, GaP, InP, Ge, and $Ga_2O_3$. An uneven structure may be formed on the first substrate 105, but is not limited thereto.

A wet etching process may be performed on the first substrate 105 to remove impurities on a surface of the first substrate 105.

Thereafter, a light emitting structure 110 including a first conductive type semiconductor layer 112, an active layer 114, and a second conductive type semiconductor layer 116 may be formed on the first substrate 105.

For example, the light emitting structure 110 may be formed using a metal organic chemical vapor deposition (MOCVD) process, a chemical vapor deposition (CVD) process, a plasma-enhanced chemical vapor deposition (PECVD), a molecular beam epitaxy (MBE) process, a hydride vapor phase epitaxy (HVPE) process, or the like.

A buffer layer (not shown) may be formed on the first substrate 105. The buffer layer may buffer a lattice mismatch between the materials constituting the light emitting structure 110 and the first substrate 105, and the buffer layer may be formed of a III-V compound semiconductor, for example, at least one of GaN, InN, AlN, InGaN, AlGaN, InAlGaN, and AlInN. An undoped semiconductor layer may be formed on the buffer layer, but is not limited thereto.

The first conductive type semiconductor layer 112 may be formed of the III-V compound semiconductor doped with a first conductive type dopant. In case where the first conductive type semiconductor layer 112 is an N-type semiconductor layer, the first conductive type dopant is an N-type dopant and may include Si, Ge, Sn, Se, and/or Te as the N-type dopant, but is not limited thereto.

The first conductive type semiconductor layer 112 may be formed of a semiconductor material having a compositional formula of $In_xAl_yGa_{1-x-y}N$ ($0 \leq x \leq 1$, $0 \leq y \leq 1$, $0 \leq x+y \leq 1$). The first conductive type semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 112 may be an N-type GaN layer, which is formed by using a CVD, an MBE, a sputtering, an HYPE, or the like. Also, the first conductive type semiconductor layer 112 may be formed by injecting trimethyl gallium (TMGa) gas, ammonia ($NH_3$) gas, nitrogen ($N_2$) gas, and silane ($SiH_4$) gas including an n-type impurity such as silicon (Si) into a chamber.

The active layer 114 is a layer in which electrons injected through the first conductive type semiconductor layer 112 meets holes injected through a second conductive type semiconductor layer 116 (that will be formed later) to emit having an energy, which is determined by an inherent energy band of a material constituting the active layer (i.e., light emitting layer).

The active layer 114 may have at least one of a single quantum well structure, a multi quantum well (MQW) structure, a quantum-wire structure, and a quantum dot structure. For example, the active layer 114 may have the MQW structure formed by injecting trimethyl gallium (TMGa) gas, ammonia ($NH_3$) gas, nitrogen ($N_2$) gas, and trimethyl indium (TMIn) gas, but is not limited thereto.

A well layer/barrier layer of the active layer 114 may be have at least one pair structure of InGaN/GaN, InGaN/InGaN, AlGaN/GaN, InAlGaN/GaN, GaAs/AlGaAs(InGaAs), GaP/AlGaP(InGaP), but is not limited thereto. The well layer may be formed of a material having a band gap lower than that of the barrier layer.

A conductive clad layer may be formed over or/and below the active layer 114. The conductive clad layer may be formed of an AlGaN-based semiconductor, and may have a band gap higher than that of the active layer 104.

The second conductive type semiconductor layer 116 may be formed of a III-V compound semiconductor in which a second conductive type dopant is doped, for example, a semiconductor material having a compositional formula of $In_xAl_yGa_{1-x-y}N$ ($0 \leq x \leq 1$, $0 \leq y \leq 1$, $0 \leq x+y \leq 1$). The second conductive type semiconductor layer 116 may be formed of at least one of GaN, AlN, AlGaN, InGaN, InN, InAlGaN, AlInN, AlGaAs, GaP, GaAs, GaAsP, and AlGaInP. In case where the second conductive type semiconductor layer 116 is a P-type semiconductor layer, the second conductive type dopant may include Mg, Zn, Ca, Sr, Ba, or the like as a P-type dopant. The second conductive type semiconductor layer 116 may be formed in a single- or multi-layer structure, but is not limited thereto.

The second conductive type semiconductor layer 116 may be a P-type GaN layer formed by injecting trimethyl gallium (TMGa) gas, ammonia ($NH_3$) gas, nitrogen ($N_2$) gas, and biscetyl cyclo pentadienyl magnesium (($EtCp_2Mg$) {Mg$(C_2H_5C_5H_4)_2$}) including a P-type impurity such as Mg into the chamber, but is not limited thereto.

In the present embodiment, the first conductive type semiconductor layer 112 may be implemented by an N-type semiconductor layer and the second conductive type semiconductor layer 116 may be implemented by a P-type semiconductor layer.

Alternatively, a semiconductor layer having a polarity opposite to that of the second conductive type, e.g., an N-type semiconductor layer (not shown) may be formed over the second semiconductor layer 116. As a result, the light emitting structure 110 may have at least one of an N-P junction structure, a P-N junction structure, an N-P-N junction structure, and a P-N-P junction structure.

Next, as shown in FIG. 3, a second electrode layer 120 is formed on the second conductive type semiconductor layer 116. The second electrode layer 120 may include an ohmic layer (not shown), a reflective layer 122, a junction layer (not shown), a supporting substrate (not shown), etc.

For example, the second electrode layer 120 may include an ohmic layer, and the ohmic layer (not shown) may ohmic-contact the light emitting structure 110 to smoothly supply a power to the light emitting structure 110. Also, the ohmic layer (not shown) may be formed by multi-stacking a single metal layer or a metal alloy layer and a metal oxide layer.

For example, the ohmic layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but is not limited thereto.

Also, the second electrode layer 120 including the reflective layer (not shown) may reflect light incident from the light emitting structure 110 to improve light extraction efficiency. The reflective layer may be formed, for example, of a metal or alloy including at least one of Ag, Ni, Al, Rh, Pd, Ir, Ru, Mg, Zn, Pt, Au, and Hf.

Also, the reflective layer may be formed in a multi-layer structure using the foregoing metal or alloy and a transparent conductive material such as IZO, IZTO, IAZO, IGZO, IGTO, AZO, ATO, etc., for example, may be stacked with IZO/Ni, AZO/Ag, IZO/Ag/Ni, AZO/Ag/Ni, or the like.

Also, in case where the second electrode layer 120 may include the junction layer (not shown), the reflective layer may function as the junction layer, or may include a barrier metal or bonding metal. For example, the junction layer may be formed of at least one of Ti, Au, Sn, Ni, Cr, Ga, In, Bi, Cu, Ag, and Ta.

Also, the second electrode layer 120 may include the supporting substrate. The supporting substrate may support the light emitting structure 110 and supply a power to the light emitting structure 110. The supporting substrate may be formed of a metal, a metal alloy or a conductive semiconductor material that has superior electrical conductivity.

For example, the supporting substrate may be formed of at least one of copper (Cu), Cu alloy, gold (Au), nickel (Ni), molybdenum (Mo), Cu—W, a carrier wafer (e.g., Si, Ge, GaAs, GaN, ZnO, SiGe, SiC, etc.).

The thickness of the supporting substrate may be varied according to a design of the light emitting device 100, for example, may be in a range of 30 μm to 500 μm. The supporting substrate may be formed by an electrochemical metal deposition method, a plating method, or a bonding method using a eutectic metal.

Next, as shown in FIG. 4, the first substrate 105 is removed to expose the first conductive type semiconductor layer 112. The first substrate 105 may be removed by using a laser lift off method or a chemical lift off method. Also, the first substrate 105 may be removed by physically grinding the first substrate 105.

Next, as shown in FIG. 4, a first amorphous layer 131 is formed on the light emitting structure 110. For example, a first pattern P may be formed using a photoresist, and then, the first amorphous layer 131 may be formed on the exposed light emitting structure 110, but is not limited thereto. For example, a first amorphous material (not shown) may be formed on an entire surface of the light emitting structure 110, and an etching process may be partially performed to form the first amorphous layer 131.

The first amorphous layer 131 may include an amorphous nitride layer or an amorphous oxide layer. For example, the first amorphous layer 131 may be formed of $Si_3N_4$, AlN, GaN, $SiO_2$, or etc., but is not limited thereto.

It is difficult to form a nitride semiconductor having a thin film shape on an amorphous layer. Thus, the nitride semiconductor may be voluntarily grown into a particle shape having a nanosize, e.g., an island shape. For example, the first amorphous layer 131 may be formed using a MOCVD process to uniformly distribute nanoparticles formed of $Si_3N_4$, AlN, or GaN, but is not limited thereto.

Next, as shown in FIG. 5, a nanostructure 140 is formed on the first amorphous layer 131. The nanostructure 140 may be partially formed on the first pattern P and may be removed in a process of removing the first pattern P.

The nanostructure 140 according to an embodiment may include a nitride semiconductor nanostructure. For example, the nanostructure 140 may be formed of $Al_xIn_yGa_{(1-x-y)}N$ ($0 \leq x \leq 1$, $0 \leq y \leq 1$), $0 \leq x+y \leq 1$).

The nanostructure 140 may include a first nanostructure 141 on the first amorphous layer 131 and a second nanostructure 142 on the first nanostructure 141. For example, the nanostructure 140 may include the first nanostructure 141 formed of AlN or GaN and the second nanostructure 142 formed of InGaN on the first nanostructure 141.

The first nanostructure 141 and the second nanostructure 142 may be repeatedly stacked several times to form the nanostructure 140. For example, a GaN/InGaN multi-layer may be deposited in the present embodiment, but is not limited thereto. Because InGaN has indium segregation that is a inherent property of a material, high-quality InGaN having a large amount of indium composition may be realized when the InGaN is formed on the nanoparicles using the indium segregation. The nanoparticle may be adjusted in size, shape, growth condiction, and In composition to realize a color having a desired wavelength, i.e., a blue color, a green color, a yellow color, or a red color.

As shown in FIG. 6, a second amorphous layer 132 may be disposed on the nanostructure 140 in the present embodiment. The second amorphous layer 132 may adopt technological properties of the first amorphous layer 131. In the present embodiment, a combination layer of the first amorphous layer 131 and the second amorphous layer 132 may be called an amorphous layer 130.

In the present embodiment, the second amorphous layer 132 may act as a passivation layer of the nitride semiconductor nanostructure 140. Also, the second amorphous layer may serve as a passivation function. Also, the nanostructure 140 and the amorphous layer 130 may be repeatedly multi-stacked to improve light emitting efficiency.

Next, as shown in FIG. 7, the first pattern P may be removed to form a first electrode 150 on the exposed light emitting structure 110, thereby completing a vertical type light emitting device chip 100.

In the present embodiment, the first electrode 150 is formed on the light emitting structure 110. The first electrode 150 may include a pad part in which a wire bonding process is performed and a finger part extending from the pad part. The finger part may be branched in a predetermined pattern shape, and may be formed in various shapes.

A roughness pattern (not shown) for enhancing light extraction efficiency may be formed on a top surface of the first conductive type semiconductor layer 112. Also, the roughness pattern may be formed on a top surface of the first electrode 150.

A passivation layer (not shown) may be formed on at least a side surface of the light emitting structure 110. Also, the passivation layer may be formed on the top surface of the first conductive type semiconductor layer 112, but is not limited thereto.

The passivation layer may be formed to electrically protect the light emitting structure 110. For example, the passivation layer may be formed of $SiO_2$, $SiO_x$, $SiO_xN_y$, $Si_3N_4$, or $Al_2O_3$, but is not limited thereto.

According to the light emitting device and the method of manufacturing of the light emitting device, an existing phosphor may be replaced with the nitride semiconductor nanostructure 140. In the present embodiment, the nitride semiconductor nanostructure 140 according to the present embodiment may be disposed on the first amorphous layer 131 using the MOCVD process and have a particle shape having a nanometer size, but a thin film shape. For example, the nitride semiconductor nanostructure 140 may have an island shape and a structure in which InGaN and GaN are multi-deposited.

In the present embodiment, since the nanostructure 140 is grown in a nitride semiconductor particle shape, but a thin film shape, a crystal quality is not deteriorated even though a large amount of indium composition is contained.

Also, the InGaN nitride semiconductor forming the nanostructure according to the present embodiment has essentially superior light emitting efficiency in material itself than a related art phosphor such as yttrium aluminum garnet (YAG).

FIG. 8 shows a second embodiment of a light emitting device 100b which includes a light emitting structure 110 having a first conductive semiconductor layer 112, an active layer 114, and a second conductive type semiconductor layer 116. The device further includes a first amorphous layer 131 on the light emitting structure 110, and a nanostructure 140 on the first amorphous layer 131. While the device in FIG. 8 is suitable for use as a lateral-type light emitting device chip, the device may be formed to be suitable with other types of chips in different embodiments.

The light emitting structure 110 may be disposed on a first substrate 105. Also, the first conductive type semiconductor layer 112 of light emitting structure 110 may be etched to expose a portion of the first conductive type semiconductor layer 112, and thus, a first electrode 130 may be disposed on the exposed first conductive type semiconductor layer 112 and a second electrode 160 may be disposed on an amorphous layer 130.

The first amorphous layer 131 may include a first ohmic dielectric 131 having the light emitting structure 110 and an ohmic property. Thus, the first ohmic dielectric 131 may function as the light emitting structure 110 and an ohmic electrode function. Since the first ohmic dielectric 131 is a dielectric, the nanostructure 140 having a particle shape may be disposed on the first ohmic dielectric 131.

Thereafter, nanostructure 140 may be disposed on the first ohmic dielectric 131, and a second amorphous layer 132 functioning as a second ohmic dielectric layer 132 may be disposed on the nanostructure 140.

The first ohmic dielectric 131 or the second ohmic dielectric 132 may be a transparent ohmic layer. Also, the first ohmic dielectric 131 or the second ohmic dielectric 132 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but is not limited thereto.

According to the light emitting device and the method of manufacturing of the light emitting device, an existing phosphor may be replaced with the nitride semiconductor nanostructure 140.

In the present embodiment, the nanostructure 140 is grown in a nitride semiconductor particle shape, instead of a thin film shape or a crystal quality, so that it is not deteriorated even though a large amount of indium composition is contained.

Also, the InGaN nitride semiconductor forming the nanostructure according to the present embodiment has essentially superior light emitting efficiency in material itself than a related art phosphor such as yttrium aluminum garnet (YAG).

FIG. 9 shows an embodiment of a light emitting device package 200 which includes a package body 205, third and fourth electrode layers 213 and 214 mounted over the package body 205, a light emitting device 100 mounted over the package body 205 and electrically connected to the third and fourth electrode layers 213 and 214, and a molding member 240 enclosing the LED 100.

The package body 205 may be formed including a silicon material, a synthetic resin material, or a metal material, and may have an inclination surface around the LED 100.

The third electrode layer 213 and the fourth electrode layer 214 are electrically separated, and function to supply power to the light emitting device 100. Also, the third and fourth electrode layers 213 and 214 may reflect light generated from the light emitting device 100 to thus increase light efficiency, and may emit heat generated from the light emitting device 100.

The light emitting device 100 may be a vertical type light emitting device shown in FIG. 1, but is not limited thereof. For example, the lateral type light emitting device of FIG. 8 may be applied to the light emitting device package 200.

The light emitting device 100 may be disposed on the package body 205 or may be disposed on the third electrode layer 213 or the fourth electrode layer 214.

The light emitting device 100 may be electrically connected to the third electrode layer 213 and/or the fourth electrode layer 214 by using any one of a wire bonding method, a flip chip method, and a die bonding method.

The present embodiment exemplarily shows that the light emitting device 100 is electrically connected to the fourth electrode layer 214 through a wire 230 and is electrically connected to the third electrode layer 213 through a direct contact with the fourth electrode layer 214, but is not limited thereto.

The molding member 240 may enclose and protect the light emitting device 100. Also, a fluorescent material may be included in the molding member 240 to change the wavelength of light emitted from the light emitting device 100.

In the present embodiment, the nanostructure 140 may be separately manufactured as an independent part, and also an existing phosphor may be replaced with the nanostructure 140. For example, the nanostructure 140 may be formed in a packaging process, unlike the description. For example, a GaN/InGaN nanostructure may be formed within a solution to form the nanostructure 140.

The light emitting device package according to the embodiment may be provided in plurality, and the plurality of light emitting device packages may be arrayed on the substrate. Optical members such as a light guide plate, a prism sheet, a diffusion sheet, and a fluorescence sheet may be disposed on a path of the light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

FIG. 10 shows one embodiment of a lighting unit 1100 which is an example of or may be included in a lighting system. The lighting unit 1100 may include a case body 1110, a light emitting module part 1130 equipped in the case body 1110, and a connection terminal 1120 equipped in the case body 1110 and supplied with an electric power from an external power supply.

The case body 1110 may be preferably formed of a material having good heat shielding characteristics, for example, a metal material or a resin material.

The light emitting module part 1130 may include a substrate 1132, and at least one light emitting device package 200 mounted on the substrate 1132.

The substrate 1132 may be a substrate in which a circuit pattern is printed on an insulator. For example, the substrate 1132 may include a general printed circuit board (PCB), a metal core PCB, a flexible PCB, a ceramic PCB, etc.

Also, the substrate 1132 may be formed of a material capable of efficiently reflecting light or may have a surface having a color capable of efficiently reflecting light, for example, white color, or silver color.

The at least one light emitting device package 200 may be mounted on the substrate 1132. Each of the light emitting device packages 200 may include at least one light emitting diode 100. The light emitting diode 100 may include a colored light emitting diode emitting red, green, blue or white light and a UV light emitting diode emitting ultraviolet rays.

The light emitting module part 1130 may have a combination of various light emitting device packages 200 to obtain desired color and luminance. For example, the light emitting module part 1130 may have a combination of a white LED, a red LED, and a green LED to obtain a high color rendering index (CRI).

The connection terminal 1120 may be electrically connected to the light emitting module part 1130 to supply a power. As shown in FIG. 10, the connection terminal 1120 may be screwed and coupled to an external power source in a socket type. For example, the connection terminal 1120 may be made in a pin type and inserted into the external power source, or may be connected to the external power source through a wire.

FIG. 10 shows one embodiment of a backlight unit 1200 which is another example of or may be included in a lighting system. The backlight unit 1200 includes a light guide panel 1210, a light emitting module part 1240 supplying light to the light guide panel 1210, a reflective member 1220 below the light guide panel 1210, and a bottom cover 1230 receiving the light guide panel 1210, the light emitting module part 1240, and the reflective member 1220.

The light guide plate 1210 diffuses light to produce planar light, and may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, or a polyethylene naphthalate (PEN) resin.

The light emitting module part 1240 provides light to at least a side surface of the light guide panel 1210, and finally acts as a light source of a display device in which the backlight unit is equipped.

The light emitting module part 1240 may contact the light guide panel 1210, and may include a substrate 1242 and a plurality of light emitting device packages 200 mounted on the substrate 1242. The substrate 1242 may contact the light guide panel 1210.

The substrate 1242 may be a PCB including a circuit pattern (not shown). The substrate 1242 may include a metal core PCB (MCPCB), a flexible PCB (FPCB), etc. as well as the general PCB, but is not limited thereto.

The plurality of light emitting device packages 200 may be mounted over the substrate 1242 such that light emitting surfaces of the plurality of light emitting device packages 200 are spaced apart by a predetermined distance from the light guide panel 1210.

The reflective member 1220 may be provided below the light guide panel 1210. The reflective member 1220 reflects light incident from a bottom surface of the light guide panel to allow the reflected light to be directed toward an upper direction, thereby capable of enhancing brightness of the backlight unit. The reflective member 1220 may be formed of, for example, PET, PC, PVC resin, or the like, but is not limited thereto.

The bottom cover 1230 may receive the light guide panel 1210, the light emitting module part 1240, the reflective member 1220, and the like. For this purpose, the bottom cover 1230 may be formed, e.g., in a box shape with a top surface opened.

The bottom cover 1230 may be formed of a metal material or resin material and may be manufactured using a process such as a press molding or an injection molding.

One or more embodiments described herein provide a light emitting device which provides white light (or light of an intended color) which operates with high performance. A light emitting device package or lighting system which includes such a device is also provided.

In one embodiment, a light emitting device comprises: a light emitting structure including a first conductive type semiconductor layer, a second conductive type semiconductor layer, and an active layer between the first conductive type semiconductor layer and the second conductive type semiconductor layer; a first amorphous layer over the light emitting structure; and a nanostructure having a particle shape with a nanosize over the first amorphous layer.

In another embodiment, a light emitting device package comprises: a package body; at least one electrode layer provided in the package body; and a light emitting device comprising: a light emitting structure including a first conductive type semiconductor layer, a second conductive type semiconductor layer, and an active layer between the first conductive type semiconductor layer and the second conductive type semiconductor layer; a first amorphous layer over the light emitting structure; and a nanostructure having a particle shape with a nanosize over the first amorphous layer.

In a further embodiment, a lighting system comprises: a light emitting module comprising a substrate and a light emitting device package over the substrate, wherein the light emitting device package comprises a package body; at least one electrode layer provided in the package body; and a light emitting device comprising: a light emitting structure including a first conductive type semiconductor layer, a second conductive type semiconductor layer, and an active layer between the first conductive type semiconductor layer and the second conductive type semiconductor layer; a first amorphous layer over the light emitting structure; and a nanostructure having a particle shape with nanosize over the first amorphous layer, the light emitting device electrically connected to the electrode layer.

According to another embodiment, a light emitting device comprises a light emitter including a first semiconductor layer of a first conductivity type, a second semiconductor layer of a second conductivity type, and an active layer between the first and second semiconductor layers; and at least one particle over the light emitter. The light travels at a first wavelength along a first path that is adjacent to the particle and at a second wavelength along a second path that passes through the particle. The particle converts the light on the second path from the first wavelength into a second wavelength, the at least one particle includes a semiconductor material, and the light at the first wavelength mixes with the light at the second wavelength to form light of a third wavelength. The at least one particle may be a nanosize particle, and the light of the third wavelength is substantially white light.

Further, a plurality of particles may be formed over the light emitter. The light emitter emits light at the first wavelength along paths that pass between adjacent pairs of the particles, and each of the particles converts light at the first wavelength into light at the second wavelength, the light traveling along the paths between adjacent pairs of the particles and the light at said second wavelength mixing to form light at the third wavelength.

The particles may be spaced from one another or formed in a cluster. Also, the second wavelength may be longer or shorter than the first wavelength. Each of the particles may include a nitride material, e.g., InGaN. Or, each particle may be made of a combination of aluminum, indium, and gallium.

In addition, each particle may include a first portion adjacent a second portion, the first portion made of a different material than the second portion. For example, the first and second portions may be formed from different nitride materials.

In addition, a first separation layer may be formed over the light emitter, herein the particle is within or adjacent to the first separation layer. The first separation layer may include a dielectric material, and the first separation layer includes a first amorphous layer. A second amorphous layer may be formed over the first amorphous layer, wherein the at least one particle contacts the first and second amorphous layers.

A physical attribute of the at least one particle causes the particle to output the light at the second wavelength. The physical attribute may be an Indium composition of the particle.

Moreover, the at least one particle includes a first portion and a second portion made of different materials, and wherein the first portion is made of aluminum nitride and the second portion is made of InGaN.

According to another embodiment, a light emitting device package comprises a package body; at least one electrode coupled to the package body; a light emitting device as described above coupled to the at least one electrode.

According to an embodiment, a lighting system comprises a light emitting module including a substrate and a light emitting device package over the substrate, wherein the light emitting device package includes: a package body; at least one electrode coupled to the package body; a light emitting device as above coupled to the at least one electrode.

According to another embodiment, a light emitting device comprises a light emitter including a first semiconductor layer of a first conductivity type, a second semiconductor layer of a second conductivity type, and an active layer between the first and second semiconductor layers; and at least one particle over the light emitter, wherein: light travels along a first path that is adjacent to the particle, the light on the first path is at a first wavelength, light travels along a second path that passes through the particle, and the particle converts the light on the second path from the first wavelength into a second wavelength, the at least one particle includes a nitride material, the at least one particle is a nanosize particle, and the light at the first wavelength mixes with the light at the second wavelength to form light of a third wavelength.

As described above, the lighting system according to the embodiments may include the light emitting device package according to the embodiments to improve the reliability of the light emitting device. When used herein, the term nanosize includes particles that have a size that falls in a range of 2~9000×10$^{-9}$ meters (2 nm~9000 nm).

Though the particles are discrete, in one embodiment the particles may be grouped in clusters. In other embodiments, the particles may be spaced, either uniformly, randomly, or in another pattern.

ALSO, according to one embodiment, each particle is made of a semiconductor material that is at least partially transparent, e.g., InGaN and GaN.

Also, in one embodiment, the particles may have a size different from a nanosize, e.g., greater or less than nanosize.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure including a first conductive semiconductor layer, a second conductive semiconductor layer, and an active layer interposed between first and second conductive semiconductor layers;
    a first amorphous layer on the light emitting structure; and
    a nano structure having a nano-size grain shape on the first amorphous layer, wherein the nano structure comprises a first nano structure on the first amorphous layer and a second nano structure on the first nano structure, and wherein the first nano structure comprises AlN or GaN and the second nano structure comprises InGaN.

2. The light emitting device as claimed in claim 1, wherein the nano structure comprises a nitride semiconductor nano structure.

3. The light emitting device as claimed in claim 2, wherein the nano structure comprises a material having a compositional formula of $Al_xIn_yGa(1-x-y)N$ ($0 \leq x \leq 1$, $0 \leq x \leq 1$), $0 \leq x+y \leq 1$).

4. The light emitting device as claimed in claim 1, wherein the nano structure comprises a plurality of stack structures of the first and second nano structures.

5. The light emitting device as claimed in claim 1, further comprising a second amorphous layer on the nano structure.

6. The light emitting device as claimed in claim 1, wherein the first amorphous layer comprises an amorphous nitride layer or an amorphous oxide layer.

7. The light emitting device as claimed in claim 1, wherein the first amorphous layer comprises a first ohmic dielectric layer having an ohmic property in terms of electric contact relation with respect to the light emitting structure.

8. The light emitting device as claimed in claim 7, further comprising a second ohmic dielectric layer on the nano structure.

9. A light emitting device package comprising:
    a light emitting device including a light emitting structure having a first conductive semiconductor layer, a second conductive semiconductor layer, and an active layer interposed between first and second conductive semiconductor layers, a first amorphous layer on the light emitting structure, and a nano structure having a nano-size grain shape on the first amorphous layer; and a package body in which the light emitting device is installed, wherein the nano structure comprises a first nano structure on the first amorphous layer and a second nano structure on the first nano structure, and wherein the first nano structure comprises AlN or GaN and the second nano structure comprises InGaN.

* * * * *